(12) United States Patent
Yang et al.

(10) Patent No.: US 9,240,353 B2
(45) Date of Patent: Jan. 19, 2016

(54) METHOD FOR MANUFACTURING ARRAY SUBSTRATE BY FORMING COMMON ELECTRODE CONNECTING NMOS IN DISPLAY AREA AND PMOS IN DRIVE AREA

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Yuqing Yang, Beijing (CN); Seung Yik Park, Beijing (CN); Byung Chun Lee, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 14/366,925

(22) PCT Filed: Dec. 9, 2013

(86) PCT No.: PCT/CN2013/088837
§ 371 (c)(1),
(2) Date: Jun. 19, 2014

(87) PCT Pub. No.: WO2015/039388
PCT Pub. Date: Mar. 26, 2015

(65) Prior Publication Data
US 2015/0214120 A1 Jul. 30, 2015

(30) Foreign Application Priority Data
Sep. 18, 2013 (CN) .......................... 2013 1 0430750

(51) Int. Cl.
*H01L 21/8238* (2006.01)
*H01L 21/77* (2006.01)
*H01L 27/12* (2006.01)
*H01L 21/84* (2006.01)

(52) U.S. Cl.
CPC ........ *H01L 21/823871* (2013.01); *H01L 21/77* (2013.01); *H01L 21/84* (2013.01); *H01L 27/12* (2013.01); *H01L 27/1262* (2013.01)

(58) Field of Classification Search
CPC .................................................. H01L 27/3272
See application file for complete search history.

(56) References Cited

U.S. PATENT DOCUMENTS

| 7,045,861 B2 * | 5/2006 | Takayama et al. ................. G02F 1/136286 257/347 |
|---|---|---|
| 2004/0218133 A1 * | 11/2004 | Park et al. ...................... 349/153 |
| 2006/0138416 A1 * | 6/2006 | Park ................................ 257/59 |
| 2013/0234144 A1 * | 9/2013 | Seo et al. ........................ 257/72 |

FOREIGN PATENT DOCUMENTS

| CN | 103296030 A | 9/2013 |
| KR | 1020130015126 A | 2/2013 |

OTHER PUBLICATIONS

Written Opinion of the International Searching Authority dated Jun. 6, 2014; PCT/CN2013/088837.

* cited by examiner

*Primary Examiner* — Michael Jung
(74) *Attorney, Agent, or Firm* — Ladas & Parry LLP (57) ABSTRACT

A method for manufacturing an array substrate includes: forming a shielding layer, an insulating buffer layer, active layers, a gate insulating layer and NMOS gate electrodes in a display area and a drive area on a substrate in sequence; forming a PMOS gate electrode in the drive area on the foregoing substrate, in which the NMOS gate electrodes and the PMOS gate electrode are provided on the same layer; meanwhile forming a first through hole in a common electrode connecting area, in which the first through hole is configured to connect the shielding layer and a source/drain electrode layer; forming an intermediate insulating layer on the foregoing substrate, forming a second through hole in the common electrode connecting area and third through holes in the display area and the drive area, in which the second through hole is formed at a same position as the first through hole and configured to connect the shielding layer and a source/drain electrode layer, and the third through holes are configured to connect the active layers and the source/drain electrode layer; and forming the source/drain electrode layer on the foregoing substrate.

12 Claims, 4 Drawing Sheets

Common Electrode Connecting Area    Display Area    Drive Area

METHOD FOR MANUFACTURING ARRAY SUBSTRATE BY FORMING COMMON ELECTRODE CONNECTING NMOS IN DISPLAY AREA AND PMOS IN DRIVE AREA

TECHNICAL FIELD

The embodiments of the present invention relate to a method for manufacturing an array substrate.

BACKGROUND

Along with the development of low temperature poly-silicon (LTPS) technology, high PPI (pixel per inch) products have gradually become the mainstream. The defects of high-PPI products comprise the reduction of the storage capacitance area, and hence additional storage capacitance must be produced to compensate the reduced storage capacitance area. The corresponding countermeasure is to additionally arrange a shielding layer at the undermost layer of an array substrate and allow the shielding layer to be connected with a common electrode. In this way, the storage capacitance between the shielding layer and active layers is additionally used to compensate the reduced storage capacitance.

Figure 1A:
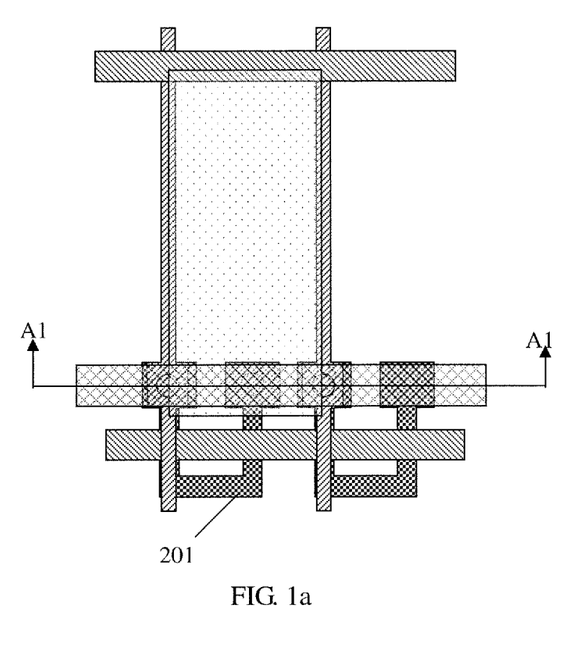
FIG. 1a is a structural planar view of a conventional array substrate.
Figure 1B:
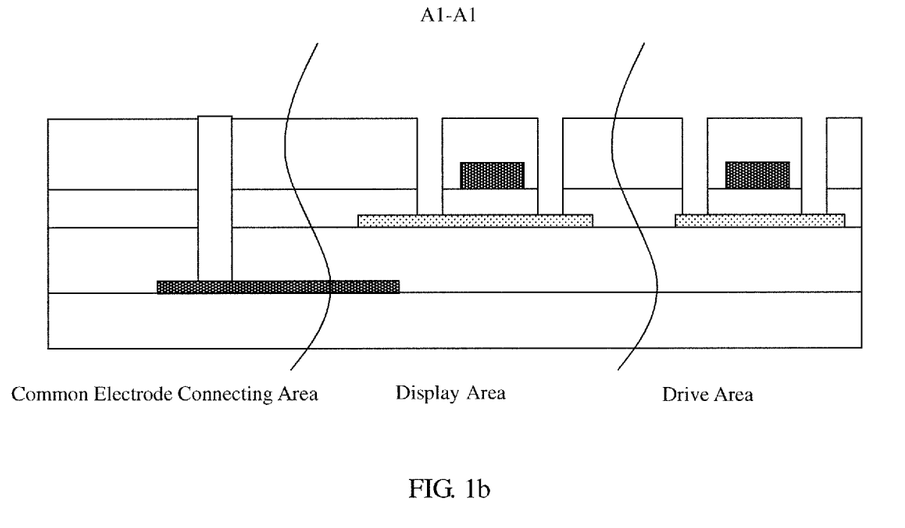

FIG. 1a is a structural planar view of an LTPS array substrate, and FIG. 1b is a sectional view of the LTPS array substrate. FIG. 1b is a structural sectional view of three areas. The three areas are a common electrode connecting area, a display area and a drive area from left to right in sequence.

The conventional process for manufacturing the LTPS array substrate comprises: depositing a shielding layer film on a substrate and forming a pattern of a shielding layer 201 by one patterning process; depositing an insulating buffer layer and an amorphous silicon (a-Si) layer on the substrate provided with the shielding layer; crystallizing a-Si into poly-silicon (p-Si) by a p-Si formation process; forming a pattern of an active layer by one patterning process; forming a gate insulating layer on the substrate provided with the active layer; forming a gate electrode on the substrate provided with the gate insulating layer, in which a gate electrode for a positive channel metal oxide semiconductor (PMOS) (PMOS gate electrode) in a drive area is formed by one patterning process, and boron ion (B) implantation is performed, and a gate electrode for a negative channel metal oxide semiconductor (NMOS) (NMOS gate electrode) in a display area and a drive area are formed by one patterning process again, and phosphorous ion (P) implantation is performed, and the gate electrode for PMOS and the gate electrode for NMOS are provided on the same layer; subsequently, forming an intermediate insulating layer on the substrate provided with the gate electrode for NMOS; forming through holes for connecting a source/drain electrode layer and the active layer by one patterning process, in which the through holes run through the intermediate insulating layer; forming a through hole for connecting the shielding layer and a source/drain electrode layer by one patterning process, in which the through hole runs through the intermediate insulating layer and the gate insulating layer; depositing a source/drain metal film on the substrate provided with the through holes for connecting the source/drain electrode layer and the active layer and the through hole for connecting the shielding layer and the source/drain electrode layer; and forming the source/drain electrode layer by one patterning process.

As the through holes for connecting the source/drain electrode layer and the active layer and the through hole for connecting the shielding layer and the source/drain electrode layer are formed by two patterning processes, the process is relatively complex. However, if two kinds of through holes are formed by one patterning process in order to simplify the process, as the through hole for connecting the source/drain electrode layer and the active layers and the through hole for connecting the shielding layer and the source/drain electrode layer have different depths, the required etching time periods are also different from each other, and hence the through holes for connecting the source/drain electrode layer and the active layers will be overetched and the through hole for connecting the shielding layer and the source/drain electrode layer will be not enough etched.

SUMMARY

The embodiments of the present invention provide a method for manufacturing an array substrate, which can guarantee the etching quality while simplifying the manufacturing process.

In one aspect, the present invention provides a method for manufacturing an array substrate, which comprises:

step 1: forming a shielding layer, an insulating buffer layer, active layers, a gate insulating layer and NMOS gate electrodes in a display area and a drive area on a substrate in sequence, and implanting phosphorous ions into the active layers;

step 2: forming a PMOS gate electrode in the drive area on the substrate provided with the shielding layer, the insulating buffer layer, the active layers, the gate insulating layer and the NMOS gate electrodes in the display area and the drive area, in which the NMOS gate electrodes and the PMOS gate electrode are provided on the same layer, meanwhile forming a first through hole in a common electrode connecting area, in which the first through hole is configured to connect the shielding layer and a source/drain electrode layer; and implanting boron ions into the active layers;

step 3: forming an intermediate insulating layer on the substrate provided with the PMOS gate electrode in the drive area and the first through hole in the common electrode connecting area, and forming a second through hole in the common electrode connecting area and third through holes in the display area and the drive area, in which the second through hole is formed at a same position as the first through hole and configured to connect the shielding layer and the source/drain electrode layer, and the third through holes are configured to connect the active layers and the source/drain electrode layer; and step 4: forming the source/drain electrode layer on the substrate provided with the intermediate insulating layer, the second through hole in the common electrode connecting area, and the third through holes in the display area and the drive area.

For instance, in the method, the step 1 may comprise: forming the shielding layer, the insulating buffer layer, the active layers and the gate insulating layer on the substrate; depositing a gate metal film on the substrate provided with the shielding layer, the insulating buffer layer, the active layers and the gate insulating layer, and coating a photoresist on the gate metal film; exposing the photoresist, in which a photoresist-retained region corresponds to a PMOS area and patterns of the NMOS gate electrodes in the display area and the drive area, and a photoresist-removed region corresponds to rest areas at which the gate metal film is not required to be retained; forming the NMOS gate electrodes in the display area and the drive area by etching the gate metal film in the photoresist-removed region; and stripping the photoresist on the photoresist-retained region.

For instance, in the method, the step 2 may comprise: coating a photoresist on the substrate provided with the shielding layer, the insulating buffer layer, the active layers, the gate insulating layer and the NMOS gate electrodes in the display area and the drive area; exposing the photoresist, in which a photoresist-retained region corresponds to patterns of the NMOS gate electrodes and the PMOS gate electrode, the entire display area and areas except a pattern of the first through hole in the common electrode connecting area, and a photoresist-removed region corresponds to the pattern of the first through hole and rest areas at which the gate metal film is not required to be retained; and forming the PMOS gate electrode in the drive area by etching the gate metal film in the photoresist-removed region, and meanwhile forming the through hole in the common electrode connecting area by etching the gate insulating layer and the insulating buffer layer in the photoresist-removed region.

For instance, in the method, the step of forming the through hole in the common electrode connecting area by etching the gate insulating layer and the insulating buffer layer in the photoresist-removed region comprises: forming the first through hole in the common electrode connecting area by etching entire gate insulating layer and entire insulating buffer layer in the photoresist-removed region; or forming the first through hole in the common electrode connecting area by etching entire gate insulating layer and a portion of the insulating buffer layer in the photoresist-removed region.

For instance, in the method, the step 3 may comprise: forming the intermediate insulating layer on the substrate provided with the PMOS gate electrode in the drive area and the first through hole in the common electrode connecting area, and coating a photoresist on the intermediate insulating layer; exposing the photoresist, in which a photoresist-removed region corresponds to patterns of the second through hole and the third through holes, and a photoresist-retained region corresponds to rest areas at which the intermediate insulating layer is not required to be removed; forming the second through hole by etching the intermediate insulating layer and a portion of the insulating buffer layer in the photoresist-removed region, and meanwhile forming the third through holes by etching the intermediate insulating layer and the gate insulating layer in the photoresist-removed region; and stripping the photoresist in the photoresist-retained region.

Or, the step 3 may comprise: forming the intermediate insulating layer on the substrate provided with the PMOS gate electrode in the drive area and the first through hole in the common electrode connecting area, and coating a photoresist on the intermediate insulating layer, exposing the photoresist, in which a photoresist-removed region corresponds to patterns of the second through hole and the third through holes, and a photoresist-retained region corresponds to rest areas at which the intermediate insulating layer is not required to be removed; forming the second through hole by etching the intermediate insulating layer in the photoresist-removed region, and meanwhile forming the third through holes by etching the intermediate insulating layer and the gate insulating layer in the photoresist-removed region; and stripping the photoresist in the photoresist-retained region.

For instance, in the method, wet etching may be adopted in the process of etching the patterns of the NMOS gate electrodes in the display area and the drive area.

For instance, in the method, dry etching may be adopted in the process of etching the pattern of the PMOS gate electrode in the drive area and the pattern in the common electrode connecting area.

In the method for manufacturing the array substrate provided by the embodiments of the present invention, as the second through hole and the third through holes are formed at the same time by one patterning process, the case that one of the second through hole and the third through holes are overetched and the other is not enough etched will not occur. Therefore, not only one patterning process can be saved but also the etching quality can be guaranteed.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

FIG. 1b is a sectional view along an A1-A1 direction of the array substrate in FIG. 1a;

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

FIGS. 2 to 7 are schematic diagrams illustrating the steps of the method for manufacturing the array substrate provided by an embodiment of the present invention. The figures illustrate sectional structures of three areas. The three areas are respectively a drive area, a display area and a common electrode connecting area.

As illustrated in FIGS. 2 to 7, the method for manufacturing the array substrate provided by the embodiment of the present invention may be performed as follows.

Figure 2:
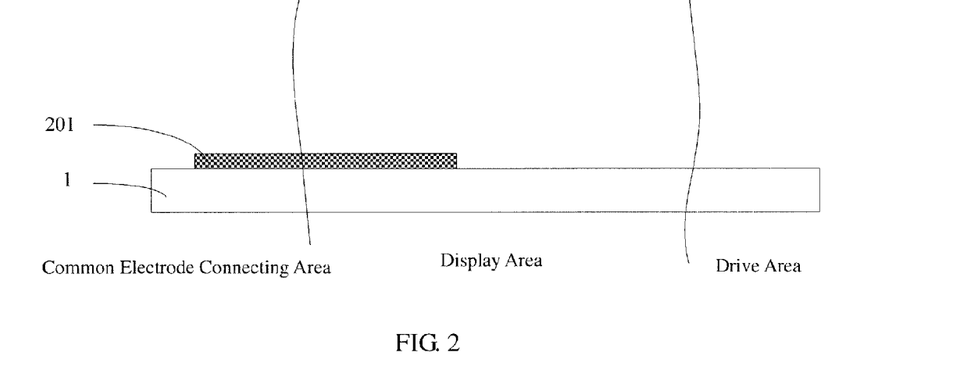
FIG. 2 is a schematic diagram of an array substrate provided by an embodiment of the present invention, obtained after a first patterning process.
Figure 3:
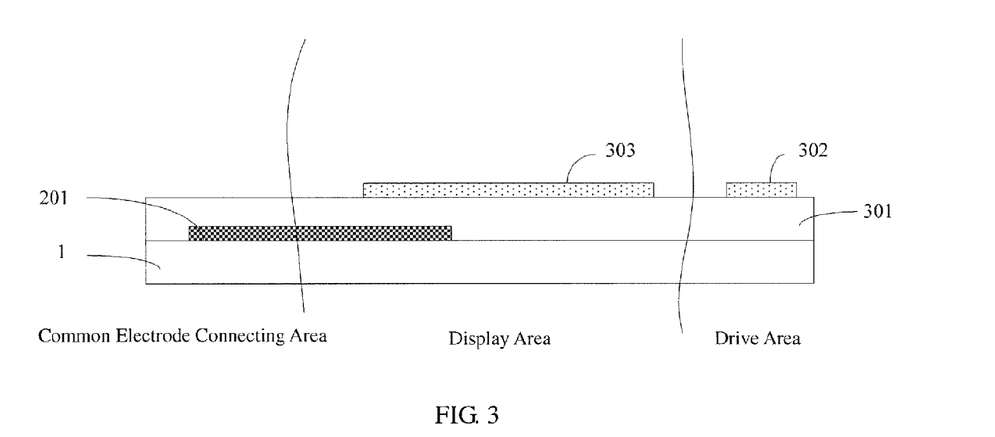
FIG. 3 is a schematic diagram of the array substrate provided by the embodiment of the present invention, obtained after a second patterning process.
Figure 4:
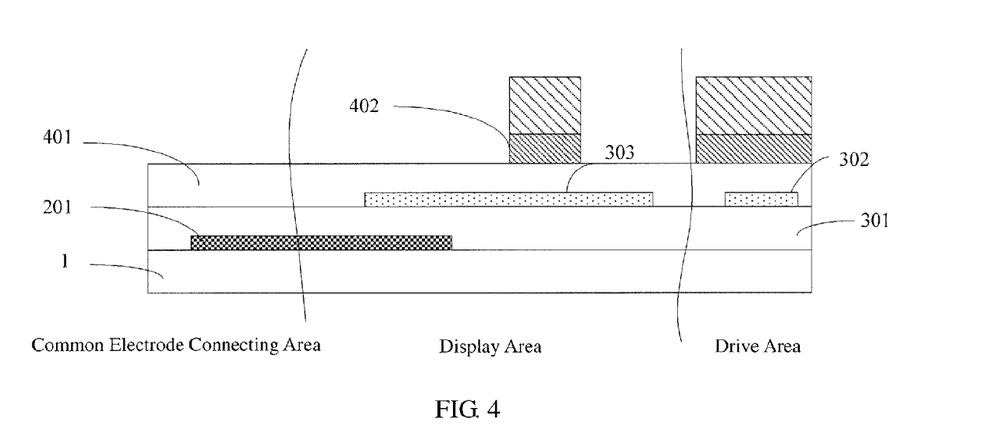
FIG. 4 is a schematic diagram of the array substrate provided by the embodiment of the present invention, obtained after a third patterning process.

Forming a shielding layer 201, an insulating buffer layer 301 and an a-Si layer on a substrate (for instance, a glass substrate, a quartz substrate or a plastic substrate) in sequence; crystallizing a-Si into p-Si by a p-Si formation process; forming patterns of active layers 302 and 303, a gate insulating layer 401 and NMOS gate electrodes 402 in a display area and a drive area (the NMOS gate electrode in the drive area is not illustrated in the figure) by one patterning process; and implanting phosphorous (P) ions into the active layers.

Figure 5:
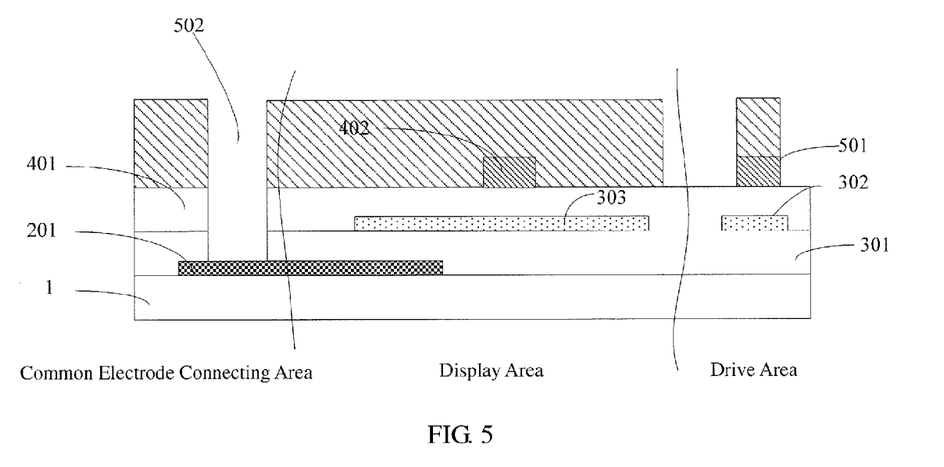
FIG. 5 is a schematic diagram of the array substrate provided by the embodiment of the present invention, obtained after a fourth patterning process.

Forming a PMOS gate electrode 501 in the drive area on the substrate provided with the shielding layer 201, the insulating buffer layer 301, the active layers 302 and 303, the gate insulating layer 401 and the NMOS gate electrodes 402 in the display area and the drive area, in which the NMOS gate electrodes and the PMOS gate electrode are provided on the same layer. Meanwhile forming a first through hole 502 in the common electrode connecting area, in which the first through hole 502 is configured to connect the shielding layer 201 and a source/drain electrode layer 701; and implanting boron (B) ions into the active layers.

Figure 6:
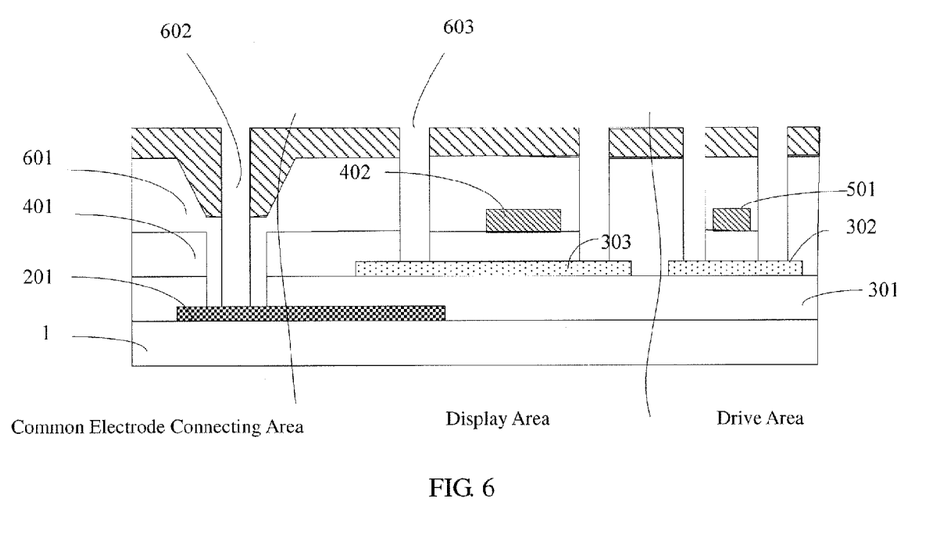
FIG. 6 is a schematic diagram of the array substrate provided by the embodiment of the present invention, obtained after a fifth patterning process.

Forming an intermediate insulating layer 601 on the substrate provided with the PMOS gate electrode 501 in the drive area and the first through hole 502 in the common electrode connecting area; and forming a second through hole 602 in the common electrode connecting area and third through holes 603 in the display area and the drive area, in which the second through hole 602 is formed at the same position as the first through hole 502 and configured to connect the shielding layer 201 and the source/drain electrode layer 701, and the third through holes 603 are configured to connect the active layers 302 and 303 and the source/drain electrode layer 701.

Figure 7:
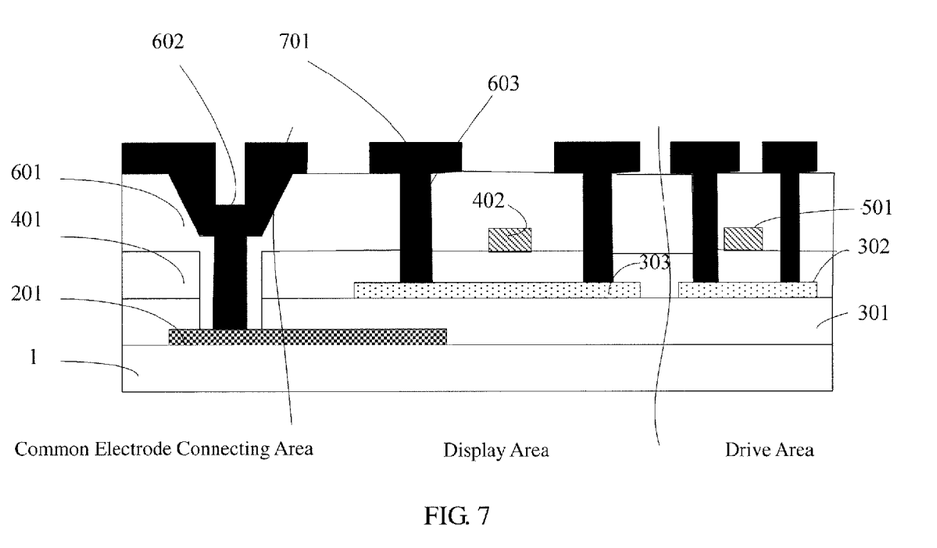
FIG. 7 is a schematic diagram of the array substrate provided by the embodiment of the present invention, obtained after a sixth patterning process.

Forming the source/drain electrode layer 701 on the substrate provided with the intermediate insulating layer 601, the second through hole 602 in the common electrode connecting area and the third through holes 603 in the display area and the drive area.

In the method for manufacturing the array substrate provided by the embodiment of the present invention, the first through hole in the common electrode connecting area is formed when the PMOS gate electrode in the drive area is formed; the intermediate insulating layer is formed on the substrate provided with the PMOS gate electrode in the drive area and the first through hole; and subsequently, the second through hole for connecting the source/drain electrode layer and the shielding layer and the third through holes for connecting the source/drain electrode layer and the active layers are formed, and the second through hole is formed at the same position as the first through hole. At this point, the intermediate insulating layer is formed with a recess at the position of the pattern of the first through hole in the common electrode connecting area. Due to the recess, the depth of the second through hole for connecting the shielding layer and the source/drain electrode layer is lower and is approximately the same as that of the third through holes for connecting the active layers and the source/drain electrode layer. At this point, the second through hole and the third through holes can be formed at the same time by one patterning process, and the case that one of the second through hole and the third through holes are overetched and the other is not enough etched will not occur. Therefore, not only one patterning process can be saved but also the etching quality can be guaranteed.

The method for manufacturing the array substrate provided by the embodiment of the present invention will be described below with reference to the preferred embodiments. In the following description, the patterning process referred to in the embodiment of the present invention may comprise photoresist coating, masking, exposing, developing, etching and other processes.

Step 11: forming a shielding layer 201 on a substrate 1.

FIG. 2 is a schematic diagram of the array substrate provided by the embodiment, obtained after the first patterning process. Firstly, one layer of shielding metal film is deposited on the substrate 1 (e.g., a glass substrate or a quartz substrate) by sputtering or thermal evaporation. The shielding metal film may be made of a metal such as Cr, W, Ti, Ta, Mo, Al and Cu or alloys thereof and may also be composed of a plurality of layers of metal films. Secondly, photoresist is coated on the shielding metal film; a common mask plate is adopted for etching the shielding metal film by the first patterning process; and a pattern of the shielding layer 201 is formed on the substrate 1. The shielding layer is connected with a common electrode and may have the function of the common electrode. Additional capacitance is provided between the shielding layer and an active layer to compensate the reduced storage capacitance. In the first patterning process of a display area, a shielding layer is also formed in a common electrode connecting area at the periphery of the array substrate, and is disposed on the same layer as the shielding layer in the display area.

Step 12: forming active layers 302 and 303 on the substrate provided with the shielding layer 201.

FIG. 3 is a schematic diagram of the array substrate provided by the embodiment, obtained after the second patterning process. Firstly, an insulating buffer layer 301 is formed through the continuous deposition of an insulating buffer layer film by plasma enhanced chemical vapor deposition (PECVD). The insulating buffer layer film may be made of oxide, nitride or oxynitride, and corresponding reaction gas may be the mixture gas of SiH4, N2O, NH3 and N2, or the mixture gas of SiH2Cl2, N2O, NH3 and N2. Secondly, a-Si is deposited on the substrate provided with the insulating buffer layer 301 and crystallized into p-Si by a p-Si formation process, and a p-Si layer is doped to form doped p-Si. A p-Si pattern, namely an active layer, is formed by etching via the second patterning process. The formed active layers comprise the active layer 302 in a drive area and the active layer 303 in the display area. The p-Si formation process is, for instance, metal-induced crystallization (MIC) or metal-induced lateral crystallization (MILC).

Step 13: forming NMOS gate electrodes 402 in the display area and the drive area on the substrate provided with the active layers 302 and 303.

FIG. 4 is a schematic diagram of the array substrate provided by the embodiment, obtained after the third patterning process. Firstly, a gate insulating layer 401 as illustrated in FIG. 4 is formed through the continuous deposition of a gate insulating layer film by PECVD. The gate insulating layer film may be made of oxide, nitride or oxynitride, and corresponding reaction gas may be the mixture gas of SiH4, N2O, NH3 and N2, or the mixture gas of SiH2Cl2, N2O, NH3 and N2. Secondly, a gate metal film is deposited on the substrate provided with the gate insulating layer 401 by sputtering or thermal evaporation. The gate metal film may be made of a metal such as Cr, W, Ti, Ta, Mo, Al and Cu or alloys thereof. Thirdly, a layer of photoresist is coated on the gate metal film; a common mask plate is adopted to expose the photoresist, in which a photoresist-retained region corresponds to a PMOS area and patterns of the NMOS gate electrodes 402 in the display area and the drive area, and a photoresist-removed region corresponds to the rest areas at which the gate metal film is not required to be retained; and the NMOS gate electrodes 402 in the display area and the drive area are formed by etching the gate metal film in the photoresist-removed region. Moreover, at this point, a gate metal film in the common electrode connecting area is also etched. Next, phosphorous (P) ions are implanted into the p-Si layer, an NMOS switch is formed; and the photoresist is removed.

Step 14: forming a PMOS gate electrode 501 in the drive area and a first through hole 502 in the common electrode connecting area on the substrate provided with the NMOS gate electrodes 402 in the display area and the drive area.

FIG. 5 is a schematic diagram of the array substrate provided by the embodiment, obtained after the fourth patterning process. A layer of photoresist is coated on the substrate provided with the NMOS gate electrodes 402 in the display area and the drive area; a common mask plate is adopted to expose the photoresist, in which a photoresist-retained region corresponds to patterns of the NMOS gate electrodes and the PMOS gate electrode 501 in the drive area, the entire display area and areas except a pattern of the first through hole 502 in the common electrode connecting area, and a photoresist-removed region corresponds to the pattern of the first through hole 502 and the rest areas at which the gate metal film is not required to be retained; and the PMOS gate electrode 501 in the drive area is formed by etching the gate metal film in the photoresist-removed region, and meanwhile the first through hole 502 in the common electrode connecting area is formed by etching the gate insulating layer 401 and the insulating buffer layer 301 in the photoresist-removed region. Subsequently, boron (B) ions are implanted into the p-Si layer; a PMOS switch is formed; the photoresist is removed.

The step of forming the first through hole 502 in the common electrode connecting area by etching the gate insulating layer 401 and the insulating buffer layer 301 in the photoresist-removed region may specifically comprise: forming the first through hole 502 in the common electrode connecting area by etching the entire gate insulating layer 401 and the entire insulating buffer layer 301 in the photoresist-removed region; or forming the first through hole 502 in the common electrode connecting area by etching the entire gate insulating layer 401 and portion of the insulating buffer layer 301 in the photoresist-removed region. In general, the gate insulating layer is very thin. The thickness of the insulating buffer layer is about 3,000 Å; the thickness of the gate insulating layer is 1,200 Å; and the thickness of the gate metal is 2,200 Å. After the gate electrode is etched, the gate insulating layer is etched, and most insulating buffer layer is also etched. That is to say, the first through hole may be or may not be extended to the shielding layer 201.

Step 15: forming a second through hole 602 in the common electrode connecting area and third through holes 603 in the display area and the drive area on the substrate provided with the PMOS gate electrode 501 in the drive area and the first through hole 502 in the common electrode connecting area. The second through hole is formed at the same position as the first through hole and configured to connect the shielding layer and a source/drain electrode layer, and the third through holes are configured to connect the active layers and the source/drain electrode layer.

FIG. 6 is a schematic diagram of the array substrate provided by the embodiment, obtained after the fifth patterning process. An intermediate insulating layer 601 is formed through the continuous deposition of an intermediate insulating layer film by PECVD. The intermediate insulating layer film may be made of oxide, nitride or oxynitride, and corresponding reaction gas may be the mixture gas of SiH4, N2O, NH3 and N2, or the mixture gas of SiH2Cl2, N2O, NH3 and N2. Subsequently, a layer of photoresist is coated on the substrate provided with the intermediate insulating layer 601; a common mask plate is adopted to expose the photoresist, in which a photoresist-removed region corresponds to patterns of the second through hole 602 and the third through holes 603, and a photoresist-retained region corresponds to the rest areas at which the intermediate insulating layer film is not required to be removed; and the second through hole 602 is formed by removing the intermediate insulating layer 601 and a portion of the insulating buffer layer 301 in the photoresist-removed region or only etching away the intermediate insulating layer 601. In other words, the second through hole 602 must be etched to reach the shielding layer 201. Meanwhile, the third through holes 603 are formed by etching the intermediate insulating layer 601 and the gate insulating layer 401 in the photoresist-removed region, and the photoresist in the photoresist-retained region is stripped off.

As the depth of the second through hole 602 and the depth of the third through holes 603 have little difference therebetween or even have no difference therebetween in this way, the second through hole 602 and the third through holes 603 can be formed by one patterning process, and the case that one of the second through hole 603 and the third through holes 603 is overetched and the other is not enough etched will not occur.

Step 16: forming a source/drain electrode layer 701 on the substrate provided with the intermediate insulating layer 601, the second through hole 603 in the common electrode connecting area and the third through holes 603 in the display area and the drive area.

FIG. 7 is a schematic diagram of the array substrate provided by the embodiment, obtained by the sensory patterning process. A source/drain metal film is deposited by sputtering or thermal evaporation on the substrate provided with the intermediate insulating layer 601, the second through hole 602 in the common electrode connecting area and the third through holes 603 in the display area and the drive area. The source/drain metal film may be made of a metal such as Cr, W, Ti, Ta, Mo, Al and Cu or alloys thereof. After the source/drain metal film is deposited, a layer of photoresist is coated; the processes of exposing, developing and etching are performed; and the source/drain electrode layer 701 is formed.

In the above steps, wet etching is, for instance, adopted in the process of etching NMOS patterns in the display area and the drive area. As etched objects involved in the display area are all metals, the wet etching process can satisfy the requirement.

In the above steps, dry etching is, for instance, adopted in the process of etching the pattern of the PMOS gate electrode in the drive area and the pattern in the common electrode connecting area. As the pattern of the PMOS gate electrode in the drive area and the pattern in the common electrode connecting area are etched at the same time and the etching of the common electrode connecting area further involves the etching of nonmetal, dry etching is preferably adopted in the process of etching the two areas.

The foregoing is only the preferred embodiments of the present invention and not intended to limit the scope of protection of the present invention. The scope of protection of the present invention should be defined by the appended claims.

The invention claimed is:

1. A method for manufacturing an array substrate, comprising:
forming a shielding layer, an insulating buffer layer, a first active layer and a second active layer, a gate insulating layer and an NMOS gate electrode in a display area on a substrate in sequence, and implanting phosphorous ions into the first active layer;
forming a PMOS gate electrode in the drive area on the gate insulating layer, in which the NMOS gate electrodes and the PMOS gate electrode are provided on tile same layer; meanwhile forming a first through hole in a common electrode connecting area, in which the first through hole is configured to connect the shielding layer and a source/drain electrode layer; and implanting boron ions into the second active layer;

forming an intermediate insulating layer on the substrate, and forming a second through hole in the common electrode connecting area and third through holes in the display area and the drive area, in which the second through hole is formed at a same position as the first through hole and configured to connect the shielding layer and a source/drain electrode layer, and the third through holes are configured to connect the active layers and the source/drain electrode layer; and forming the source/drain electrode layer on the substrate, in which the source/drain electrode layer is connected with the shielding layer and the active layers through the second through hole and the third through holes.

2. The method for manufacturing the array substrate according to claim 1, wherein after the shielding layer, the insulating buffer layer, the first and second active layers and the gate insulating layer are formed on the substrate in sequence, a gate metal film is deposited on the substrate and photoresist is coated on the gate metal film;

the photoresist is subjected to exposure, in which a photoresist-retained region corresponds to a PMOS area and patterns of the NMOS gate electrodes in the display area and the drive area, and a photoresist-removed region corresponds to rest areas at which the gate metal film is not required to be retained; and the NMOS gate electrodes in the display area and the drive area are formed by etching the gate metal film in the photoresist-removed region, and the photoresist in the photoresist-retained region is stripped off.

3. The method for manufacturing the array substrate according to claim 2, wherein photoresist is coated on the substrate provided with the shielding layer, the insulating buffer layer, the first and second active layers, the gate insulating layer and the NMOS gate electrodes in the display area and the drive area;

the photoresist is subjected to exposure, in which a photoresist-retained region corresponds to patterns of the NMOS gate electrode and the PMOS gate electrode in the drive area, the entire display area and areas except a pattern of the first through hole in the common electrode connecting area, and a photoresist-removed region corresponds to the pattern of the first through hoe and rest areas at which the gate metal film is not required to be retained; and the PMOS gate electrode in the drive area is formed by etching the gate metal film in the photoresist-removed region, and meanwhile the first through hole in the common electrode connecting area is formed by etching the gate insulating layer and the insulating buffer layer in the photoresist-removed region; and the photoresist in the photoresist-retained region is stripped off.

4. The method for manufacturing the array substrate according to claim 3, wherein forming of the first through hole in the common electrode connecting area by etching the gate insulating layer and the insulating buffer layer in the photoresist-removed region comprises:

forming the first through hole in the common electrode connecting area by etching the entire gate insulating layer and the entire insulating buffer layer in the photoresist-removed region; or forming the first through hole in the common electrode connecting area by etching the entire gate insulating layer and a portion of the insulating buffer layer in the photoresist-removed region.

5. The method for manufacturing the array substrate according to claim 1, wherein after the intermediate insulating layer is formed on the substrate provided with the PMOS gate electrode in the drive area and the first through hole in the common electrode connecting area, photoresist is coated on the intermediate insulating layer;

the photoresist is subjected to exposure, in which a photoresist-removed region corresponds to patterns of the second through hole and the third through holes, and a photoresist-retained region corresponds to rest areas at which the intermediate insulating layer is not required to be removed; and the second through hole is formed by etching the intermediate insulating layer and a portion of the insulating buffer layer in the photoresist-removed region, and meanwhile the third through holes are formed by etching the intermediate insulating layer and the gate insulating layer in the photoresist-removed region; and the photoresist in the photoresist-retained region is stripped off.

6. The method for manufacturing the array substrate according to claim 1, wherein after the intermediate insulating layer is formed on the substrate provided with the PMOS gate electrode in the drive area and the first through hole in the common electrode connecting area, photoresist is coated on the intermediate insulating layer;

the photoresist is subjected to exposure, in which a photoresist-removed region corresponds to patterns of the second through hole and the third through holes, and a photoresist-retained region corresponds to rest areas at which the intermediate insulating layer is not required to be removed; and the second through hole is formed by etching the intermediate insulating layer in the photoresist-removed region, and meanwhile the third through holes are formed by etching the intermediate insulating layer and the gate insulating layer in the photoresist-removed region; and the photoresist in the photoresist-retained region is stripped off.

7. The method for manufacturing the array substrate according to claim 6, wherein wet etching is adopted in the process of etching the patterns of the NMOS gate electrodes in the display area and the drive area.

8. The method for manufacturing the array substrate according to claim 6, wherein dry etching is adopted in the process of etching the pattern of the PMOS gate electrode in the drive area and the pattern in the common electrode connecting area.

9. The method for manufacturing the array substrate according to claim 2, wherein after the intermediate insulating layer is formed on the substrate provided with the PMOS gate electrode in the drive area and the first through hole in the common electrode connecting area, photoresist is coated on the intermediate insulating layer;

the photoresist is subjected to exposure, in which a photoresist-removed region corresponds to patterns of the second through hole and the third through holes, and a photoresist-retained region corresponds to rest areas at which the intermediate insulating layer is not required to be removed; and the second through hole is formed by etching the intermediate insulating layer and a portion of the insulating buffer layer in the photoresist-removed region, and meanwhile the third through holes are formed by etching the intermediate insulating layer and the gate insulating layer in the photoresist-removed region; and the photoresist in the photoresist-retained region is stripped off.

10. The method for manufacturing the array substrate according to claim 2, wherein after the intermediate insulating layer is formed on the substrate provided with the PMOS gate electrode in the drive area and the first through hole in the common electrode connecting area, photoresist is coated on the intermediate insulating layer;

the photoresist is subjected to exposure, in which a photoresist-removed region corresponds to patterns of the second through hole and the third through holes, and a photoresist-retained region corresponds to rest areas at which the intermediate insulating layer is not required to be removed; and  the second through hole is formed by etching the intermediate insulating layer in the photoresist-removed region, and meanwhile the third through holes are formed by etching the intermediate insulating layer and the gate insulating layer n the photoresist-removed region; and the photoresist in the photoresist-retained region is stripped off.

11. The method for manufacturing the array substrate according to claim 10, wherein wet etching is adopted in the process of etching the patterns of the NMOS gate electrodes in the display area and the drive area.

12. The method for manufacturing the array substrate according to claim 10, wherein dry etching is adopted in the process of etching the pattern of the PMOS gate electrode in the drive area and the pattern in the common electrode connecting area.

\* \* \* \* \*